(12) United States Patent
Tachimori

(10) Patent No.: US 9,742,381 B2
(45) Date of Patent: Aug. 22, 2017

(54) PULSE WIDTH MODULATOR AND NON-TRANSITORY COMPUTER READABLE MEDIUM FOR STORING PROGRAM FOR PULSE WIDTH MODULATOR

(71) Applicant: Onkyo Corporation, Osaka (JP)

(72) Inventor: Nobuya Tachimori, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 15/342,419

(22) Filed: Nov. 3, 2016

(65) Prior Publication Data

US 2017/0149417 A1 May 25, 2017

(30) Foreign Application Priority Data

Nov. 19, 2015 (JP) ................................. 2015-226867

(51) Int. Cl.
 *H03M 3/00* (2006.01)
 *H03K 3/017* (2006.01)
(52) U.S. Cl.
 CPC ............ *H03K 3/017* (2013.01); *H03M 3/366* (2013.01); *H03M 3/424* (2013.01)
(58) Field of Classification Search
 CPC .............................. H03K 3/017; H03M 3/424
 USPC ........................................ 341/143, 144, 152
 See application file for complete search history.

(56) References Cited

U.S. PATENT DOCUMENTS

| 6,373,334 | B1 | 4/2002 | Melanson | |
| 6,933,871 | B2* | 8/2005 | Melanson | H03M 7/3006 |
| | | | | 341/143 |
| 7,164,376 | B2* | 1/2007 | Gealow | H03M 3/392 |
| | | | | 341/143 |
| 7,714,675 | B2 | 5/2010 | Wang | |
| 8,779,956 | B2* | 7/2014 | Rangan | H03M 3/428 |
| | | | | 341/118 |
| 2005/0093727 | A1* | 5/2005 | Trotter | H03M 7/3011 |
| | | | | 341/143 |

FOREIGN PATENT DOCUMENTS

JP 4116005 B2 4/2008

* cited by examiner

*Primary Examiner* — Peguy Jean Pierre
(74) *Attorney, Agent, or Firm* — Renner, Otto, Boisselle & Sklar, LLP

(57) ABSTRACT

The pulse width modulator includes a subtraction unit configured to perform subtraction between an m value digital signal and a pulse width modulation signal; a feedforward filter unit configured such that a ΔΣ modulator to which an output signal of the subtraction unit is input and which includes integrators of a second order or higher is in cascade connection, and configured to operate with a sampling frequency FS; a product-sum computing unit configured to operate with a sampling frequency (FS/n) (n: an integer of two or more) to perform product-sum computing of an output signal of each integrator of the feedforward filter unit; and a pulse width modulation unit configured to operate with the sampling frequency (FS/n) to perform pulse width modulation of an output signal of the product-sum computing unit to output a pulse width modulation signal.

4 Claims, 2 Drawing Sheets

PWM (=(n+1)value)

Fig. 2B n=2

| Input x | PWM Value | |
|---|---|---|
| x>0.5 | 11 | ▬ |
| -0.5<x<=0.5 | 10 | ▄_ |
| x<=-0.5 | 00 | _ |

Fig. 2C n=4

| Input x | PWM Value | |
|---|---|---|
| x>0.75 | 1111 | ▬▬ |
| 0.25<x<=0.75 | 1110 | ▬_ |
| -0.25<x<=0.25 | 1100 | ▄__ |
| -0.75<x<=-0.25 | 1000 | ▃___ |
| x<=-0.75 | 0000 | ____ |

PULSE WIDTH MODULATOR AND NON-TRANSITORY COMPUTER READABLE MEDIUM FOR STORING PROGRAM FOR PULSE WIDTH MODULATOR

BACKGROUND OF THE INVENTION

1. Field of the Invention

The present invention relates to a pulse width modulator and a non-transitory computer readable medium for storing a program for the pulse width modulator. In particular, the present invention relates to a pulse width modulator including a ΔΣ modulator and configured to convert an m value (m: an integer of three or more) digital signal into a binary pulse width modulation signal to output the binary pulse width modulation signal, and relates to a program for such a pulse width modulator.

2. Description of the Related Art

A pulse width modulator has been sometimes used, which includes a ΔΣ modulator configured to output an n-bit digital audio signal in order to convert a multibit digital audio signal such as a pulse code modulation (PCM) audio signal into a pulse width modulation (PWM) signal of two or more values.

The ΔΣ modulator is provided with a quantizer in a feedback loop of a loop filter, and power spectrum density distribution of quantized noise sampled at high speed is shaped. Thus, a dynamic range of a passband is improved. As a result, an m value digital signal can be encoded into an n value digital signal whose quantization word length is shorter than that of the m value digital signal. With noise shaping operation as described above and a sampling frequency set at sufficiently-high, there is an advantage that the output signal of the ΔΣ modulator has a wide dynamic range with a small quantization value number.

Since the output signal of the ΔΣ modulator needs to have a sampling frequency much higher than an audio signal band to be reproduced, there is an advantage that a binary pulse width modulation signal converted from the output signal of the ΔΣ modulator is more easily handled. Thus, the pulse width modulator including the ΔΣ modulator has been sometimes used for a switching amplifier called a "digital amplifier" in a typical case.

For example, a delta-sigma modulator including a loop filter and a comparator has been typically employed (see Japanese Patent No. 4116005). In such a delta-sigma modulator, a pulse width control circuit configured to control a minimum pulse width of a signal quantized by the comparator is provided on a loop of the delta-sigma modulator, and the pulse width control circuit controls the minimum pulse width depending on a value of an input signal of the delta-sigma modulator or a value of a signal containing a component of the input signal. Moreover, another ΔΣ modulator has been typically employed (see U.S. Pat. No. 6,373,334, U.S. Pat. No. 7,714,675). In such a ΔΣ modulator, a residual error between an ideal output and an actual output in the ΔΣ modulator is fed back in order to reduce noise and distortion in a switching amplifier.

Moreover, the pulse width modulator including the ΔΣ modulator is suitable for performing digital signal processing for a multibit digital audio signal in a computing circuit such as a central processing unit (CPU) or a digital signal processor (DSP) to output the resultant signal. Note that in order to realize such a configuration by the digital signal processing, there is a problem different from that in the case of use for the switching amplifier. When an m value multibit digital audio signal is converted into a binary pulse width modulation signal by ΔΣ modulation, if an attempt is made to increase the length of the pulse width modulation signal according to a large n value, the number of computing increases in proportion to an increased pulse width, leading to impractical implementation. Since a ΔΣ modulation signal sampling frequency is significantly high, an amount of time per sample is shortened, and an increase in the number of computing leads to impractical implementation of signal processing.

SUMMARY OF THE INVENTION

The present invention has been made for the purpose of easily solving the above-described problems, and an object of the present invention is to provide a pulse width modulator including a ΔΣ modulator so that operation in signal processing is, without an increase in the number of computing, stabilized to provide a favorable pulse width modulation signal even in the case of an output pulse width modulation signal a length of the pulse width of which is long and to provide a program for the pulse width modulator.

The pulse width modulator of the present invention is a pulse width modulator for converting an m value (m: an integer of three or more) digital signal into a pulse width modulation signal of two or more values. The pulse width modulator includes a subtraction unit configured to perform subtraction between the m value digital signal and the pulse width modulation signal; a feedforward filter unit configured such that a ΔΣ modulator to which an output signal of the subtraction unit is input and which includes integrators of a second order or higher is in cascade connection, and configured to operate with a sampling frequency FS; a product-sum computing unit configured to operate with a sampling frequency (FS/n) (n: an integer of two or more) to perform product-sum computing of an output signal of each integrator of the feedforward filter unit; and a pulse width modulation unit configured to operate with the sampling frequency (FS/n) to perform pulse width modulation of an output signal of the product-sum computing unit to output a pulse width modulation signal.

Preferably, in the pulse width modulator of the present invention, when the pulse width modulation signal is an l value (l: an integer of two or more) digital signal, the pulse width modulation unit includes a quantizer configured to convert the output signal of the product-sum computing unit into an (n+1) value digital signal or an ((n+1)*(l-1)-(l-2)) value digital signal to output the (n+1) value digital signal or the ((n+1)*(l-1)-(l-2)) value digital signal, and a pulse width conversion unit configured to convert an output signal of the quantizer into the pulse width modulation signal with a minimum width of (1/FS) and a maximum width of (n/FS) to output the pulse width modulation signal.

A non-transitory computer readable medium for storing a program according to the present invention is a non-transitory computer readable medium for storing a program for causing a computer to execute signal processing for converting an m value (m: an integer of three or more) digital signal into a pulse width modulation signal of two or more values. The program causes a processor of the computer to execute the step of executing signal processing for performing subtraction between the m value digital signal and the pulse width modulation signal, the step of executing signal processing of a feedforward filter unit configured such that a ΔΣ modulator to which the subtracted output signal is input and which includes integrators of a second order or higher is in cascade connection and configured to operate with a sampling frequency FS, the step of executing signal processing of a product-sum computing unit configured to operate with a sampling frequency (FS/n) (n: an integer of two or more) to perform product-sum computing of an output signal of each integrator of the feedforward filter unit, and the step of executing signal processing for performing, by operation with the sampling frequency (FS/n), pulse width modulation of an output signal of the product-sum computing unit to output a pulse width modulation signal.

Preferably, in the non-transitory computer readable medium for storing the program according to the present invention, when the pulse width modulation signal is an l value (l: an integer of two or more) digital signal, the step of executing the signal processing for outputting the pulse width modulation signal includes the step of executing signal processing of a quantizer to convert an output signal of the product-sum computing unit into an (n+1) value digital signal or an ((n+1)*(l−1)−(l−2)) value digital signal to output the (n+1) value digital signal or the ((n+1)*(l−1)−(l−2)) value digital signal, and the step of executing signal processing for converting an output signal of the quantizer into the pulse width modulation signal with a minimum width of (1/FS) and a maximum width of (n/FS) to output the pulse width modulation signal.

Features of the present invention will be described below.

The pulse width modulator of the present invention is the pulse width modulator for converting the m value (m: an integer of three or more) digital signal into the pulse width modulation signal of two or more values, and can be implemented not only by a hardware configuration but also by execution of the program including the plural steps of causing the computer to execute the signal processing. In particular, in the pulse width modulator of the present invention, the number of computing including ΔΣ modulation is reduced. Thus, even if a 1-bit ΔΣ modulator configured to operate with an extremely-high sampling frequency to output a binary digital signal is provided, the case of the configuration using digital signal processing has an advantage.

The pulse width modulator of the present invention includes the subtraction unit configured to perform subtraction between the m value digital signal and the pulse width modulation signal; the feedforward filter unit configured such that the ΔΣ modulator to which the output signal of the subtraction unit is input and which includes the integrators of the second order or higher is in cascade connection, and configured to operate with the sampling frequency FS; the product-sum computing unit configured to operate with the sampling frequency (FS/n) (n: an integer of two or more) to perform product-sum computing of the output signal of each integrator of the feedforward filter unit; and the pulse width modulation unit configured to operate with the sampling frequency (FS/n) to perform pulse width modulation of the output signal of the product-sum computing unit to output the pulse width modulation signal.

In the pulse width modulator of the present invention, the ΔΣ modulator operates with the sampling frequency FS, whereas the product-sum computing unit and the pulse width modulation unit operate with the sampling frequency (FS/n) as a lower frequency. Thus, the pulse width modulator converts the input m value digital signal into the pulse width modulation digital signal of two or more values to output the resultant signal, and the number of product-sum computing is significantly reduced. As a result, there is an advantageous that pulse width modulation digital signal processing is easily implemented.

In the pulse width modulator of the present invention, when the pulse width modulation signal is the l value (l: an integer of two or more) digital signal, the pulse width modulation unit may include the quantizer configured to convert the output signal of the product-sum computing unit into the (n+1) value digital signal or the ((n+1)*(l−1)−(l−2)) value digital signal to output the (n+1) value digital signal or the ((n+1)*(l−1)−(l−2)) value digital signal, and the pulse width conversion unit configured to convert the output signal of the quantizer into the pulse width modulation signal with the minimum width of (1/FS) and the maximum width of (n/FS) to output the pulse width modulation signal. When the pulse width of the pulse width modulation signal is determined depending on a quantization bit number of the quantizer, there are the following advantages: operation in pulse width modulation including 1-bit ΔΣ modulation signal processing can be stabilized, and a quantization error in conversion into the pulse width modulation signal as the output l value digital signal of two or more values is reduced. Moreover, since the pulse width modulation signal with the minimum width of (1/FS) and the maximum width of (n/FS) according to the quantization bit number (n+1) of the quantizer is fed back, such feedback is substantially equivalent to feedback of a feedback signal with the sampling frequency FS. This allows stable ΔΣ modulation signal processing.

In the pulse width modulator and the non-transitory computer readable medium for storing the program according to the present invention, operation in the signal processing is, without an increase in the number of computing, stabilized to provide a favorable pulse width modulation signal even in the case of an output pulse width modulation signal a length of the pulse width of which is long.

BRIEF DESCRIPTION OF THE DRAWINGS

FIGS. 2A to 2C are a diagram and tables for describing operation of a pulse width modulation unit 6 of the pulse width modulator 1;

DETAILED DESCRIPTION OF THE PREFERRED EMBODIMENTS

Hereinafter, a pulse width modulator and a program for the pulse width modulator according to preferred embodiments of the present invention will be described, but the present invention is not limited to these embodiments.

First Embodiment

Figure 1:
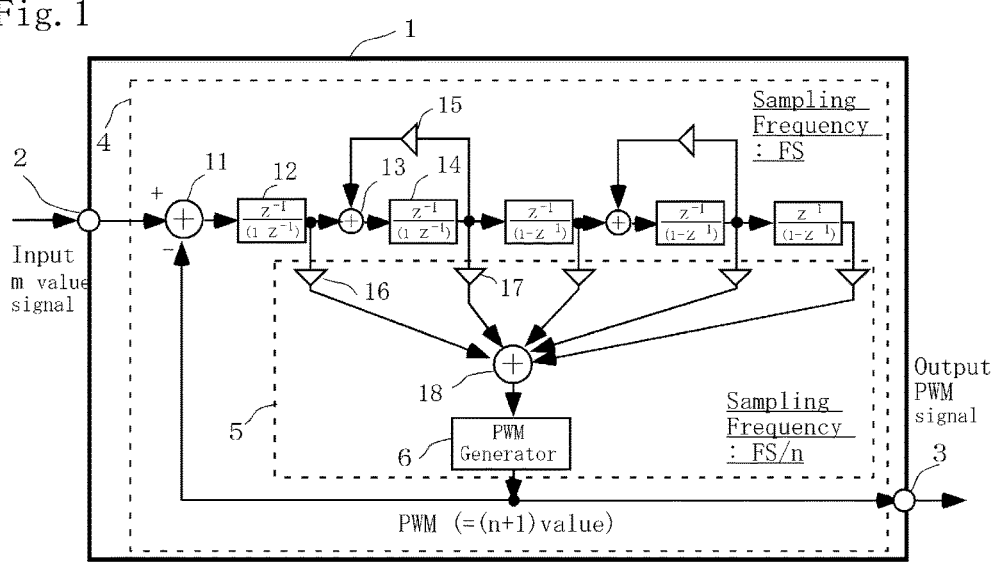
FIG. 1 is a diagram for describing a pulse width modulator 1 of a first embodiment.

FIG. 1 is a diagram for describing a pulse width modulator 1 of a preferred embodiment of the present invention. Specifically, the pulse width modulator 1 is a pulse width modulator configured to modulate, into a binary pulse width modulation signal, an m value (m: an integer of three or more) digital signal as a digital audio signal input to an input terminal 2 to output the resultant signal from an output terminal 3. FIG. 1 is a block diagram of an internal configuration of the pulse width modulator 1. Note that part of the configuration, the internal configuration, etc. for which description is not necessarily made will not be shown in the figures, and description thereof will not be made.

The pulse width modulator 1 may include a digital signal processor (DSP). In this case, a (not-shown) microcomputer as a control circuit configured to control the DSP is connected to the microcomputer to load and execute a program in the DSP. The program is stored in a non-transitory computer readable medium configured to store programs. Thus, the pulse width modulator 1 is applicable to audio equipment configured such that ΔΣ modulation and product-sum computing of a multibit digital audio signal is performed at a feedforward filter unit 4 to convert the multibit digital audio signal into a binary pulse width modulation signal, and then, the binary pulse width modulation signal is output as a modulated audio signal.

For example, an m value digital audio signal input to the pulse width modulator 1 of the present embodiment is a digital audio signal obtained by upsampling of a 16-bit PCM signal as a data set of synchronized stereo audio signals L, R to a signal with a sampling frequency FS much higher than an audible frequency band. Note that the input m value digital audio signal may be a single-channel monophonic signal or a multichannel signal such as a signal of three or more channels. Thus, FIG. 1 illustrates, as a whole, a flow for a single signal corresponding to an m value digital audio signal as a monophonic signal.

The pulse width modulator 1 includes the feedforward filter unit 4, a product-sum computing unit 5, and a pulse width modulation unit 6 configured to output a pulse width modulation signal. The m value digital signal input to the input terminal 2 of the pulse width modulator 1 is input to a later-described subtracter 11 of the feedforward filter unit 4. The feedforward filter unit 4 outputs an output signal of each integrator to the product-sum computing unit 5. The product-sum computing unit 5 performs pulse width modulation of an output signal of each integrator computing unit to output a pulse width modulation signal to the output terminal 3 and the subtracter 11. The output signal subjected to pulse width modulation is fed back to the feedforward filter unit 4.

The feedforward filter unit 4 is configured such that a ΔΣ modulator including integrators of a second order or higher is in cascade connection. Specifically, the feedforward filter unit 4 includes the subtracter 11 to which the m value digital signal input to the input terminal 2 and a later-described feedback signal are input, an integrator 12 to which an output signal of the subtracter 11 is input, an adder 13 to which an output signal of the integrator 12 is input, and an integrator 14 to which an output signal of the adder 13 is input. An output signal of the integrator 14 is input to still another integrator while being branched into a multiplier 15 configured to multiply the output signal of the integrator 14 by a coefficient to input the resultant signal to the adder 13. Note that a configuration subsequent to the integrator 14 is similar to above, and therefore, description thereof will not be repeated. In the case illustrated in FIG. 1, the feedforward filter unit 4 forms a five-order partial feedback 1-bit ΔΣ modulator. Note that the integrator 12 includes a delay device ($Z^{-1}$). The delay device is configured to hold a single sample of an input digital signal to output the signal with a delay.

The feedforward filter unit 4 outputs the output signals of all integrators including the integrators 12, 14 to the product-sum computing unit 5 configured to perform product-sum computing. For example, the output signal of the integrator 12 is multiplied by a predetermined coefficient at a multiplier 16, and then, is output to an adder 18. Similarly, the output signal of the integrator 14 is multiplied by a predetermined coefficient at a multiplier 17, and then, is output to the adder 18. The adder 18 performs product-sum computing of the output signals of all integrators, and then, inputs the resultant signal to the later-described pulse width modulation unit 6. The pulse width modulation unit 6 outputs a pulse width modulation signal such that one branched portion of the pulse width modulation signal is output to the output terminal 3 and the other branched portion of the pulse width modulation signal is, as a feedback signal, fed back to the subtracter 11 of the feedforward filter unit 4. As described above, the pulse width modulator 1 performs pulse width modulation processing including 1-bit ΔΣ modulation signal processing.

Note that in order to form a higher-order ΔΣ modulator, an integrator, an adder, and a multiplier may be added to the above-described configuration of the feedforward filter unit 4, or may be omitted from the above-described configuration of the feedforward filter unit 4. Moreover, the feedforward filter unit 4 may be a feedforward filter forming a high-order ΔΣ modulator including a loop filter. Thus, detailed description of operation of the feedforward filter unit 4 of the pulse width modulator 1 of the present embodiment will not be made.

Note that the feedforward filter unit 4 operates with the input signal sampling frequency FS to execute the ΔΣ modulation signal processing. On the other hand, the product-sum computing unit 5 and the pulse width modulation unit 6 operate with a sampling frequency (FS/n) lower than the sampling frequency FS to output the pulse width modulation signal, where "n" is an integer of two or more and relates to a quantization bit number (n+1) of a later-described quantizer included in the pulse width modulation unit 6 and to the pulse width of the later-described pulse width modulation unit. Thus, the product-sum computing unit 5 and the pulse width modulation unit 6 perform, once in n times, product-sum computing of the output of each integrator of the feedforward filter unit 4 operating with the sampling frequency FS. In the pulse width modulator 1, the pulse width of the pulse width modulation signal is determined according to the quantization bit number (n+1) of the quantizer.

Figure 2A:
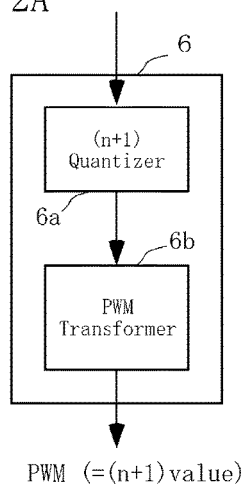

FIGS. 2A to 2C are a diagram and tables for describing operation of the pulse width modulation unit 6 of the pulse width modulator 1. Specifically, FIG. 2A is a block diagram for describing a configuration of the pulse width modulation unit 6, and FIG. 2B or 2C is a table for describing operation of the pulse width modulation unit 6 in the case of n=2 or n=4.

As illustrated in FIG. 2A, the pulse width modulation unit 6 is configured such that a quantizer 6a configured to convert an input signal into a digital signal of a bit number (n+1) to output the resultant signal and a pulse width conversion unit 6b configured to convert the signal quantized to the bit number (n+1) by the quantizer 6a into a pulse width modulation signal to output the resultant signal are in cascade connection. Since the pulse width modulation unit 6 operates with the sampling frequency (FS/n), the pulse width conversion unit 6b converts the output signal of the quantizer 6a into the pulse width modulation signal with a minimum width of (1/FS) and a maximum width of (n/FS), and then, outputs the resultant signal.

As illustrated in FIG. 2B, in the case of n=2, the quantizer 6a of the pulse width modulation unit 6 outputs any of three bit values of (11, 10, 00) according to an input signal x from the adder 18 of the product-sum computing unit 5. When the input signal x exceeds 0.5, the quantizer 6a outputs a value of 11, and then, the pulse width conversion unit 6b outputs, according to the value of 11, a binary pulse width modulation signal with a maximum width of 2/FS. Similarly, when the input signal x is higher than −0.5 and equal to or lower than 0.5, the quantizer 6a outputs a value of 10, and then, the pulse width conversion unit 6b outputs, according to the value of 10, a binary pulse width modulation signal showing a high value during a period of 1/FS. Similarly, when the input signal x is equal to or lower than −0.5, the quantizer 6a outputs a value of 00, and then, the pulse width conversion unit 6b outputs, according to the value of 00, "0" as a binary pulse width modulation signal.

As illustrated in FIG. 2C, in the case of n=4, the quantizer 6a of the pulse width modulation unit 6 outputs any of five bit values of (1111, 1110, 1100, 1000, 0000) according to the input signal x from the adder 18 of the product-sum computing unit 5. When the input signal x exceeds 0.75, the quantizer 6a outputs a value of 1111, and then, the pulse width conversion unit 6b outputs, according to the value of 1111, a binary pulse width modulation signal with a maximum width of 4/FS. Similarly, when the input signal x is higher than 0.25 and equal to or lower than 0.75, the quantizer 6a outputs a value of 1110, and then, the pulse width conversion unit 6b outputs, according to the value of 1110, a binary pulse width modulation signal showing a high value during a period of 3/FS. Similarly, when the input signal x is higher than −0.25 and equal to or lower than 0.25, the quantizer 6a outputs a value of 1100, and then, the pulse width conversion unit 6b outputs, according to the value of 1100, a binary pulse width modulation signal showing a high value during a period of 2/FS. Similarly, when the input signal x is higher than −0.75 and equal to or lower than −0.25, the quantizer 6a outputs a value of 1000, and then, the pulse width conversion unit 6b outputs, according to the value of 1000, a binary pulse width modulation signal showing a high value during the period of 1/FS. Similarly, when the input signal x is equal to or lower than −0.75, the quantizer 6a outputs a value of 0000, and then, the pulse width conversion unit 6b outputs, according to the value of 0000, "0" as a binary pulse width modulation signal.

Thus, the binary pulse width modulation signal as described above is fed back to the subtracter 11 of the feedforward filter unit 4. Although the pulse width modulation unit 6 operates with the sampling frequency (FS/n), the pulse width modulation signal with the minimum width of (1/FS) and the maximum width of (n/FS) according to the quantization bit number (n+1) of the quantizer 6a is fed back. Thus, for the subtracter 11 of the feedforward filter unit 4 operating with the sampling frequency FS, such feedback is equivalent to feedback of a feedback signal with the sampling frequency FS. This allows stable ΔΣ modulation signal processing.

Figure 3:
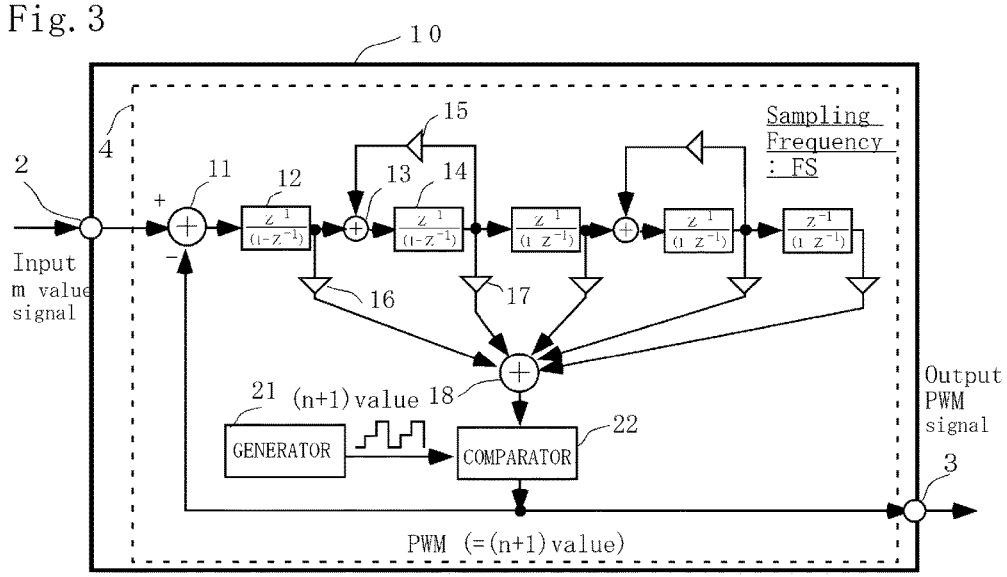
FIG. 3 is a diagram for describing a pulse width modulator 10 of a comparative example.

FIG. 3 is a diagram for describing a pulse width modulator 10 of a comparative example. Specifically, the pulse width modulator 10 is common to the pulse width modulator 1 of the above-described embodiment, except that multipliers 16, 17 and an adder 18 operate, as a product-sum computing unit 5, with a sampling frequency FS and that a pulse width modulator including a signal generator 21 configured to generate a rectangular wave for quantization to an (n+1) bit and a comparator 22 operates with the sampling frequency FS instead of the pulse width modulation unit 6. Overlapping description will not be made below.

A feedforward filter unit 4, the product-sum computing unit 5, and the pulse width modulation unit (21, 22) in the pulse width modulator 10 operate with the input signal sampling frequency FS to execute ΔΣ modulation signal processing. That is, there is no section operating with a sampling frequency (FS/n) as a lower frequency than the sampling frequency FS, and for this reason, there is a disadvantage that a calculation processing load including product-sum computing in the product-sum computing unit 5 is greater than that in the case of the above-described embodiment.

For example, in the case where the sampling frequency FS=11.2 MHz and a quantization bit number of a quantizer and a maximum width value of the pulse width modulator are 3 (n=2), the calculation load in reproduction at higher speed is greater with reference to 1× speed reproduction for reproducing an audio signal at a normal reproduction speed. The pulse width modulator 1 of the above-described embodiment is operable at 7.45× speed, whereas the pulse width modulator 10 of the comparative example is operable only at 6.51× speed. This indicates that the pulse width modulator 1 of the above-described embodiment includes the product-sum computing unit 5 and the pulse width modulation unit 6 operating with the sampling frequency (FS/n) as the lower frequency than the sampling frequency FS, and as a result, the calculation load decreases due to a decrease in the number of computing per unit time.

In both cases of the above-described embodiment and the comparative example, a pulse width modulation signal accuracy can be increased with an increase in an integer n of 2 or more. Note that in the comparative example, when an attempt is made to increase the length of the pulse width modulation signal according with a large n value, the number of computing increases in proportion to an increased pulse width, leading to impractical implementation. However, in the case of the above-described embodiment, the product-sum computing unit 5 and the pulse width modulation unit 6 operating with the sampling frequency (FS/n) are provided, and therefore, an increase in the number of computing can be suppressed as compared to the case of the comparative example.

Moreover, according to the pulse width modulator 1 of the above-described embodiment, there is an advantage that in the case of n=2, the more-stable pulse width modulator 1 can be realized with a simple configuration as compared to the case of the comparative example. For example, in the case of n=2, operation of the signal generator 21 and the comparator 22 in the pulse width modulator 10 of the comparative example is equivalent to operation as a non-uniform PWM (NUPWM). On the other hand, operation of the pulse width modulation unit 6 of the above-described embodiment is equivalent to operation as a uniform PWM (UPWM). Thus, a quantization error and quantization noise can be substantially reduced without taking a temporal error in pulse width modulation into consideration.

Note that the pulse width modulator 1 of the above-described embodiment may be configured such that the pulse width modulation unit 6 outputs a pulse width modulation signal as an l value (l: an integer of 2 or more) digital signal. In this case, the quantizer 6a of the pulse width modulation unit 6 may convert the input signal x from the adder 18 of the product-sum computing unit 5 into an (n+1) value digital signal or an ((n+1)*(l−1)−(l−2)) value digital signal, and then, may output the resultant signal. The pulse width modulation signal to be output is multivalued as a digital signal of two or more values, and therefore, the pulse width modulator 1 can further reduce a quantization error and quantization noise.

Figure 4:
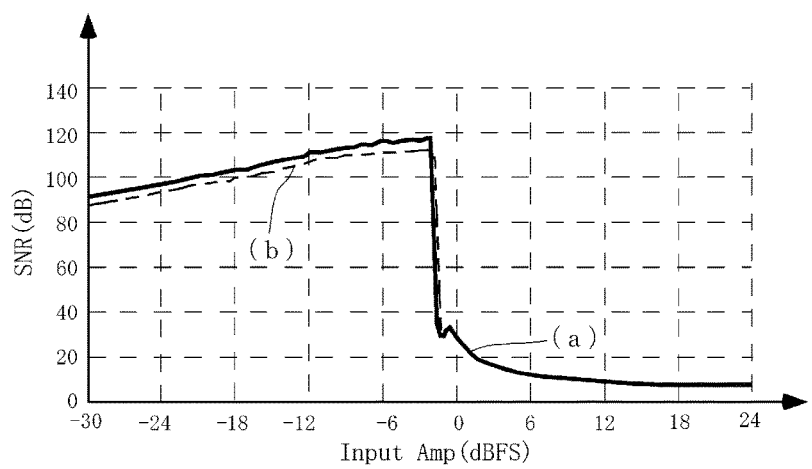
FIG. 4 is a graph for describing a characteristic curve of an SQNR level with respect to an input signal level of a ΔΣ modulator of the pulse width modulator 1, 10.

FIG. 4 is a graph for describing a characteristic curve of an SQNR level with respect to an input signal level of the ΔΣ modulator of the pulse width modulator 1. The horizontal axis represents an amplitude level of sinusoidal signal input of an m value digital signal input to the input terminal 2, and a full scale amplitude level is 0 dBFS. The vertical axis represents, for sinusoidal signal input, a signal-to-quantization-noise power ratio (SQNR) level in a signal band, the SQNR level being an index well-used regarding the accuracy of conversion of the ΔΣ modulator. The SQNR level preferably exhibits a large value indicating such a state that a signal level of an output n value digital signal is substantially much higher than a noise level across a wide dynamic range. Moreover, it is preferable that the SQNR level does not greatly change in accordance with the input signal level. In unstable operation in ΔΣ modulation signal processing, the SQNR level sharply drops due to an increased in the input m value digital signal level.

A curve illustrated in (a) of FIG. 4 is the characteristic curve of the SQNR level of the ΔΣ modulator of the pulse width modulator 1 of the above-described embodiment. Note that such a curve indicates the case where the feedforward filter unit 4 of the pulse width modulator 1 employs (not-shown) eighth-order cascade resonator feedback (CRFB: cascade of resonators with distributed feedback). Moreover, a curve illustrated in (b) of FIG. 4 indicates a characteristic curve of the SQNR level of the ΔΣ modulator of the pulse width modulator 10 of the comparative example.

As illustrated in (b) of FIG. 4, the pulse width modulator 10 of the comparative example remains at a maximum value of 112 dB when the amplitude level of the sinusoidal signal input of the input m value digital signal increases to exceed −6 dBFS. Subsequently, the SQNR level sharply drops to a SQNR value close to 0 dB. This means that operation of the pulse width modulator 10 is unstable, leading to the state in which a 1-bit digital signal as a proper ΔΣ modulation signal is not output from the output terminal 3.

On the other hand, as illustrated in (a) of FIG. 4, the pulse width modulator 1 of the above-described embodiment reaches a maximum value of 118 dB when the amplitude level of the sinusoidal signal input of the input m value digital signal increases to exceed −6 dBFS, and can maintain, on average, a higher value than that of the pulse width modulator 10 of the comparative example. Subsequently, the SQNR level similarly sharply drops, but even if the amplitude level of the input increases, the SQNR does not reach 0 dB. This means that stable operation of the ΔΣ modulator of the pulse width modulator 1 of the above-described embodiment is ensured, and a proper ΔΣ modulated signal is output as compared to the comparative example.

As described above, in the pulse width modulator 1 of the above-described embodiment, operation in the ΔΣ modulation signal processing can be stabilized as compared to a typical technique even when the amplitude level of the input signal is relatively high. As a result, even when the amplitude level of the input signal is relatively high, no intervention needs to be made to correct an internal state of the ΔΣ modulator, and operation in pulse width modulation signal processing can be stabilized.

Note that the case of m=2^16 and n=2 has been described above. However, the m value indicating the number of quantization values of the digital audio signal input to the input terminal 2 may be an integer of three or more. Moreover, the n value indicating the number of quantization values of the digital audio signal output to the output terminal 3 may be an integer of two or more, the integer being less than m.

In the above-described embodiment, the pulse width modulator 1 includes the digital signal processor (DSP). Needless to say, the pulse width modulator 1 realizing the pulse width modulation signal processing including ΔΣ modulation may only include other (not-shown) processor having a computing capacity for handling an audio signal. In this case, a program described below is also loaded and executed in the processor of the computer. Thus, the above-described reference numerals of FIGS. 1 to 4 will be used in common by description made below, and a flowchart of the program for the pulse width modulation signal processing is omitted.

The program for the pulse width modulation signal processing causes the processor to execute the following steps: step S1 of executing signal processing for performing subtraction between the m value digital signal and the pulse width modulation signal; step S2 of executing signal processing of the feedforward filter unit configured such that the ΔΣ modulator to which the subtracted output signal is input and which includes the integrators of the second order or higher is in cascade connection and configured to operate with the sampling frequency FS; step S3 of executing signal processing of the product-sum computing unit configured to operate with the sampling frequency (FS/n) (n: an integer of two or more) to perform product-sum computing of the output signal of each integrator of the feedforward filter unit; and step S4 of executing signal processing for performing, by operation with the sampling frequency (FS/n), pulse width modulation of the output signal of the product-sum computing unit to output the pulse width modulation signal.

Step S4 includes step S5 of executing signal processing of the quantizer to convert the output signal of the product-sum computing unit into the (n+1) value digital signal to output the (n+1) value digital signal, and step S6 of executing signal processing for converting the output signal of the quantizer into the pulse width modulation signal with the minimum width of (1/FS) and the maximum width of (n/FS) to output the pulse width modulation signal. Thus, at steps S4, S5, S6 including the signal processing for product-sum computing and pulse width modulation, product-sum computing is, once in n times, performed for the output of each integrator of the feedforward filter unit 4 operating with the sampling frequency FS, and therefore, the number of computing is reduced.

As a result, the program for the pulse width modulation signal processing can reduce the number of computing per unit time, and therefore, reduce the calculation load. Moreover, in the case where the input signal amplitude level is relatively high, there is also an advantage that a quantization error is reduced. No intervention needs to be made to correct the internal state of the ΔΣ modulator, and operation in the pulse width modulation signal processing can be stabilized.

Note that the program for the pulse width modulation signal processing is executable not only in the processor of the computer but also in electronic equipment provided with a processor being able to handle a digital audio signal. Even in the case of equipment not including a processor dedicated to an audio signal, such as a mobile phone or a smartphone, a CPU may have a capacity for computing a digital audio signal.

The pulse width modulator and the program for the pulse width modulator according to the present invention are applicable not only to a stereo device configured to reproduce a stereo audio signal, but also to a sound reproduction system including a multichannel surround sound reproduction device, portable equipment, and electronic equipment such as a smartphone.

What is claimed is:
1. A pulse width modulator for converting an m value digital signal, where m indicates an integer of three or more, into a pulse width modulation signal of two or more values, comprising:

a subtraction unit configured to perform subtraction between the m value digital signal and the pulse width modulation signal;

a feedforward filter unit
configured such that a ΔΣ modulator to which an output signal of the subtraction unit is input and which includes integrators of a second order or higher is in cascade connection, and
configured to operate with a sampling frequency FS;

a product-sum computing unit configured to operate with a sampling frequency (FS/n), where n indicates an integer of two or more, to perform product-sum computing of an output signal of each integrator of the feedforward filter unit; and a pulse width modulation unit configured to operate with the sampling frequency (FS/n) to perform pulse width modulation of an output signal of the product-sum computing unit to output a pulse width modulation signal.

2. The pulse width modulator according to claim 1, wherein
when the pulse width modulation signal is an l value digital signal, where l indicates an integer of two or more, the pulse width modulation unit includes
a quantizer configured to convert the output signal of the product-sum computing unit into an (n+1) value digital signal or an ((n+1)*(l−1)−(l−2)) value digital signal to output the (n+1) value digital signal or the ((n+1)*(l−1)−(l−2)) value digital signal, and
a pulse width conversion unit configured to convert an output signal of the quantizer into the pulse width modulation signal with a minimum width of (1/FS) and a maximum width of (n/FS) to output the pulse width modulation signal.

3. A non-transitory computer readable medium for storing a program for causing a computer to execute signal processing for converting an m value digital signal, where m indicates an integer of three or more, into a pulse width modulation signal of two or more values,
wherein the program causes a processor of the computer to execute
a step of executing signal processing for performing subtraction between the m value digital signal and the pulse width modulation signal,
a step of executing signal processing of a feedforward filter unit configured such that a ΔΣ modulator to which a subtracted output signal is input and which includes integrators of a second order or higher is in cascade connection and configured to operate with a sampling frequency FS,
a step of executing signal processing of a product-sum computing unit configured to operate with a sampling frequency (FS/n), where n is an integer of two or more, to perform product-sum computing of an output signal of each integrator of the feedforward filter unit, and
a step of executing signal processing for performing, by operation with the sampling frequency (FS/n), pulse width modulation of an output signal of the product-sum computing unit to output a pulse width modulation signal.

4. The non-transitory computer readable medium for storing the program according to claim 3, wherein
when the pulse width modulation signal is an l value digital signal, where l indicates an integer of two or more, the step of executing the signal processing for outputting the pulse width modulation signal includes
a step of executing signal processing of a quantizer to convert an output signal of the product-sum computing unit into an (n+1) value digital signal or an ((n+1)*(l−1)−(l−2)) value digital signal to output the (n+1) value digital signal or the ((n+1)*(l−1)−(l−2)) value digital signal, and
a step of executing signal processing for converting an output signal of the quantizer into the pulse width modulation signal with a minimum width of (1/FS) and a maximum width of (n/FS) to output the pulse width modulation signal.

\* \* \* \* \*